(12) United States Patent
Jien et al.

(10) Patent No.: US 10,770,121 B1
(45) Date of Patent: Sep. 8, 2020

(54) MEMORY DEVICE AND MEMORY WRITING METHOD

(71) Applicants: Jiangsu Advanced Memory Technology Co., Ltd., Jiangsu (CN); ALTO MEMORY TECHNOLOGY CORPORATION, Hsinchu County (TW)

(72) Inventors: Fan-Yi Jien, Hsinchu County (TW); Jui-Jen Wu, Hsinchu County (TW); Junhua Zheng, Hsinchu County (TW); Chengyu Xu, Hsinchu County (TW)

(73) Assignees: JIANGSU ADVANCED MEMORY TECHNOLOGY CO., LTD., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/391,297

(22) Filed: Apr. 23, 2019

(30) Foreign Application Priority Data

Feb. 27, 2019 (CN) .......................... 2019 1 0146939

(51) Int. Cl.
*G11C 7/00* (2006.01)
*G11C 7/10* (2006.01)

(52) U.S. Cl.
CPC .......... *G11C 7/1096* (2013.01); *G11C 7/1078* (2013.01)

(58) Field of Classification Search
CPC .............. G11C 7/1096; G11C 13/0004; G11C 13/0007; G11C 13/0011
See application file for complete search history.

(56) References Cited

U.S. PATENT DOCUMENTS

| 8,908,426 | B2 | 12/2014 | Wang et al. | |
|---|---|---|---|---|
| 10,515,697 | B1* | 12/2019 | Jain | ........................ G11C 7/062 |
| 2009/0052233 | A1* | 2/2009 | Nakai | .................. G11C 7/1048 365/163 |
| 2009/0122593 | A1* | 5/2009 | Cho | ........................ G11C 8/08 365/148 |
| 2013/0201750 | A1 | 8/2013 | Lee et al. | |
| 2013/0208528 | A1 | 8/2013 | Kwak et al. | |

FOREIGN PATENT DOCUMENTS

| CN | 1734671 A | 2/2006 |
|---|---|---|
| CN | 1933023 A | 3/2007 |
| CN | 103443861 A | 12/2013 |

\* cited by examiner

*Primary Examiner* — Uyen Smet
(74) *Attorney, Agent, or Firm* — CKC & Partners Co., LLC (57) ABSTRACT

A memory device includes a memory array, write drivers and a controller. The memory array includes a plurality of memory units respectively arranged in a plurality of bit lines. The write drivers generate a plurality of write bit signals respectively inputted to the bit lines. The controller provides a voltage mode control signal and a current mode control signal. The controller is electrically coupled to the write drivers. Each of the write drivers generates a respective write bit signal of each of the write drivers according to the voltage mode control signal and the current mode control signal. When each of the memory units is in a set state, the controller outputs the voltage mode control signal and the current mode control signal to the write drivers. When each of the memory units is in a reset state, the controller outputs the voltage mode control signal to the write drivers.

12 Claims, 9 Drawing Sheets

MEMORY DEVICE AND MEMORY WRITING METHOD

CROSS-REFERENCE TO RELATED APPLICATION

This application claims priority to Chinese Application Serial Number 201910146939.1, filed Feb. 27, 2019, which is herein incorporated by reference.

BACKGROUND

Technical Field

The present disclosure relates to a memory device and a memory writing method.

Description of Related Art

In current memory technology, as the functions and the capacity of a memory are more increased, smaller chip size of the memory is required accordingly.

Therefore, how to store huge data in the memory device and effectively reduce the circuit area of the memory device is a very challenging design topic.

SUMMARY

An aspect of the present disclosure relates to a memory device includes: a memory array, a plurality of write drivers, and a controller. A memory array includes a plurality of memory units respectively arranged in a plurality of bit lines. A plurality of write drivers configured to generate a plurality of write bit signals respectively input to the bit lines. A controller configured to provide a voltage mode control signal and a current mode control signal. The controller is electrically coupled to the write drivers. Wherein each of the write drivers respectively generates, according to the voltage mode control signal and the current mode control signal, one of the write bit signals corresponding to each of the write drivers. In response to each of the memory units being in a set state, the controller outputs the voltage mode control signal and the current mode control signal to the write drivers. In response to each of the memory units being in a reset state, the controller outputs the voltage mode control signal to the write drivers.

An aspect of the present disclosure relates to a memory device. Each of the write drivers comprises a current mirror, a first transistor, and a second transistor. The current mirror comprises an input terminal, a plurality of switches, and a plurality of current branches and the current mirror is electrically coupled to the controller. The current mode control signal controls the input terminal of the current mirror, and accordingly the current mirror outputs a current mirror signal. Each one of the switches controls a corresponding one of the current branches to be turned on or off, so as to adjust the magnitude of the current mirror signal. The first transistor comprises a control terminal, and the voltage mode control signal controls the control terminal of the first transistor. The second transistor comprises a control terminal and the current mirror signal controls the control terminal of the second transistor. An output terminal of the first transistor is connected to an output terminal of the second transistor. To output one of the write bit signals, the first transistor is turned on or off according to the voltage mode control signal, and the second transistor is turned on or off according to the current mirror signal.

An aspect of the present disclosure relates to a memory device. Wherein, in response to each of the memory units being in the set state, the controller generates the voltage mode control signal and the current mode control signal to simultaneously turn on the first transistor and the second transistor, so that one of the write bit signals is switched from a low level to a set pulse level and sustains at the set pulse level for a first time period. Immediately after the first time period, the controller turns off the first transistor and sustains the current mode control signal, so that the second transistor is gradually turned off from the turn-on state according to the magnitude of the current mirror signal in a second time period. One of the write bit signals is gradually decreased from a high level to the low level in the second time period; and the high level is between the set pulse level and the low level.

An aspect of the present disclosure relates to a memory device. Wherein, in response to each of the memory units being in the reset state, the controller generates the voltage mode control signal to turn on the first transistor and switch one of the write bit signals from a low level to a reset pulse level, and the write bit signal sustains at the reset pulse level for a third time period. The controller turns off the first transistor to decrease one of the write bit signals from the reset pulse level to the low level.

An aspect of the present disclosure relates to a memory device, wherein the controller controls the write drivers, so that the plurality of rising edges of the write bit signals are staggered from each other.

Another aspect of the present disclosure relates to a memory writing method which is configured to generate a plurality of write bit signals. The write bit signals are configured to write a plurality of memory units of plurality of bit lines, the memory writing method includes as follows: The state of the memory units being written into a set state or a reset state is determined. In response to the memory units being required to be written into a set state, a voltage mode control signal and a current mode control signal are outputted to a plurality of write drivers, so that the write drivers generate the write bit signals according to the voltage mode control signal and the current mode control signal. In response to the memory units being required to be written into a reset state, the voltage mode control signal is outputted, so that the write drivers generate the write bit signals according to the voltage mode control signal.

An aspect of the present disclosure relates to a memory writing method, wherein each of the write drivers includes a first transistor and a second transistor, and the output terminal of the first transistor is connected to the output terminal of the second transistor. The memory writing method includes as follows: A current mirror signal is generated according to the current mode control signal, and the second transistor is turned on or off based on the current mirror signal so as to output the one of the write bit signals. The first transistor is turned on or off based on the voltage mode control signal so as to output the one of the write bit signals.

An aspect of the present disclosure relates to a memory writing method. Wherein, in response to the memory units required to be written into a set state, the memory writing method includes as follows: Both the voltage mode control signal and the current mode control signal are simultaneously generated to turn on the first transistor and the second transistor and switch one of the write bit signals from a low level to a set pulse level; and the write bit signal sustains at the set pulse level for a first time period. After the first time period, the current mode control signal is sustained so that the second transistor is gradually turned off from the on state according to the current mirror signal. One of the write bit signals is gradually decreased from a high level to the low level in the second time period; and the high level is between the set pulse level and the low level.

An aspect of the present disclosure relates to a memory writing method, wherein, in response to the memory units being required to be written into a reset state, the memory writing method further includes that the voltage mode control signal is turned off after the first time period, and the current mode control signal is sustained and inputted to the write drivers.

An aspect of the present disclosure relates to a memory writing method, wherein the time sequences of a plurality of write drivers are controlled, so that a plurality of rising edges of the write bit signals are staggered from each other.

An aspect of the present disclosure relates to a memory writing method. In response to the memory units required to be written into a reset state, the memory writing method includes as follows: The voltage mode control signal is generated to turn on the first transistor and switch one of the write bit signals from a low level to a reset pulse level; and the write bit signals is sustained at the reset pulse level for a third time period. The first transistor is turned off, and one of the write bit signals is decreased from the reset pulse level to the low level.

An aspect of the present disclosure relates to a memory writing method, wherein the time sequences of a plurality of write drivers time are controlled, so that a plurality of rising edges of the write bit signals are staggered from each other.

A further aspect of the present disclosure relates to a memory writing method, which is configured to generate a plurality of write bit signals. The write bit signals are configured to write a plurality of memory units of a plurality of bit lines. The memory writing method includes as follows: The state of the memory units being written into a set state or a reset state is determined. In response to the memory units required to be written into a set state, a first control signal is outputted to a plurality of write drivers, so that the write drivers generate the write bit signals based on the first control signal. In response to the memory units required to be written into a reset state, a second control signal is outputted, so that the write drivers generate the write bit signals based on the second control signal. The time sequences of the write drivers are controlled, so that a plurality of rising edges of the write bit signals are staggered from each other.

In summary, through the memory device and the memory writing method described in the above embodiments, the memory device could control memory units to be written to reset state and/or set state effectively, and the sequential time shift approach applied to the memory unit reduces the area of the charge pump in the memory device effectively.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." The term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In order to solve the problem that a large number of instantaneous write currents are required for simultaneous writing of a plurality of bits in present memories, a large-area charge pump circuit is needed in a memory circuit. The present disclosure proposes a memory device capable of effectively reducing the area of the charge pump circuit of the memory circuit.

Figure 1:
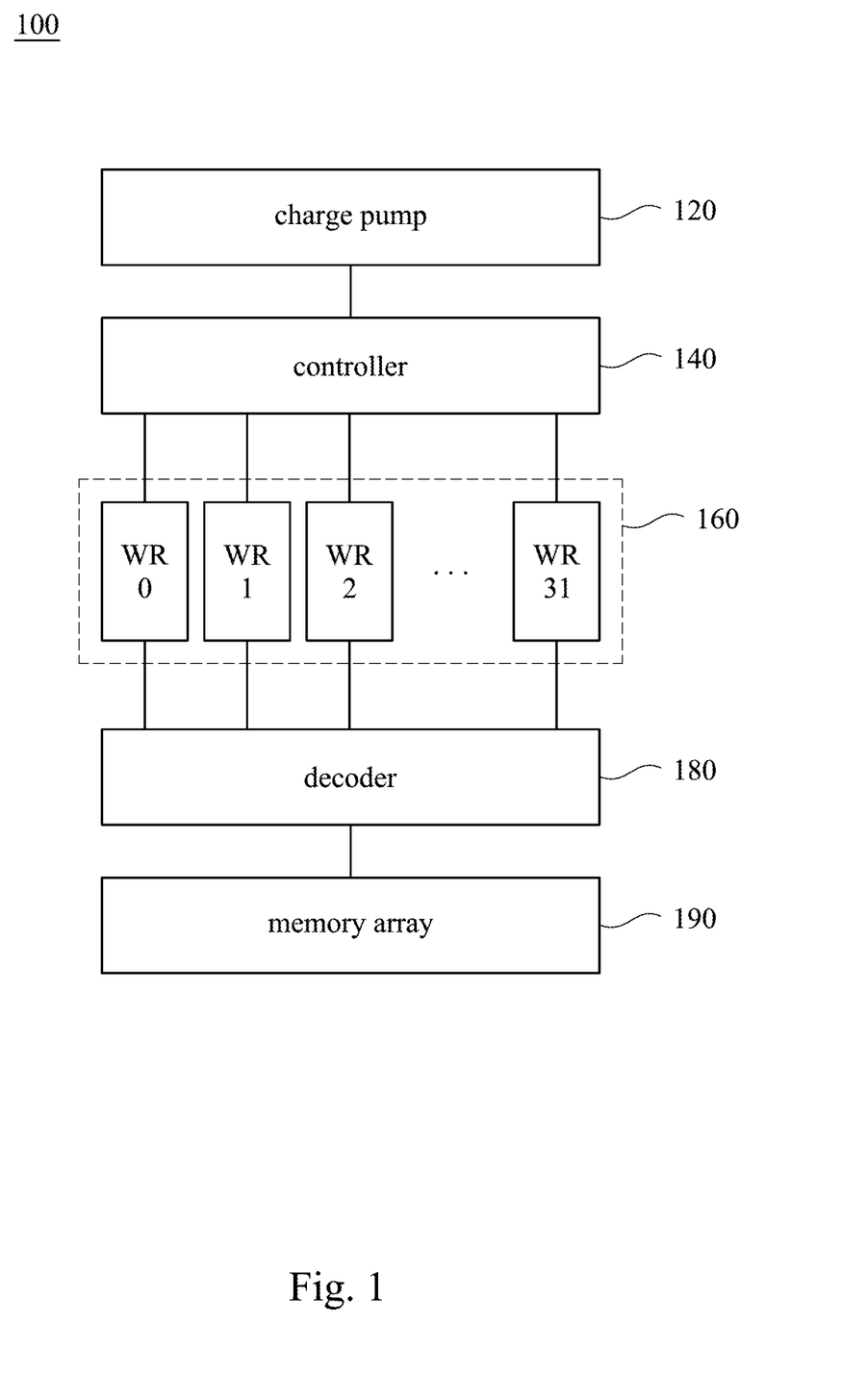
FIG. 1 shows a schematic diagram of a memory device according to one embodiment of the present disclosure.

FIG. 1 shows a schematic diagram of a memory device 100 according to one embodiment of the present disclosure. As shown in FIG. 1, the memory device 100 includes a charge pump 120, a controller 140, a writing module 160, a decoder 180, and a memory array 190. The memory array 190 includes multiple memory units. The multiple memory units are respectively arranged in multiple bit lines.

Reference is made to FIG. 1. The charge pump 120 is electrically coupled to the controller 140. The controller 140 is electrically coupled to the writing module 160. The writing module 160 is electrically coupled to the decoder 180. The decoder 180 is electrically coupled to the memory array 190. The writing module 160 may include multiple write drivers. As the embodiments shown in FIG. 1, the writing module 160 includes 32 write drivers, such as write driver WR0, write driver WR1, and write driver WR2 to write driver WR31. In practical applications, the number of write drivers included in the write module 160 is not limited to 32, and it may be determined according to the number of bit lines of the memory array 190.

In practical applications, for example, the controller 140 may be a microcontroller unit (MCU). Various approaches with same function of data processing are within the contemplated scope of this disclosure.

The memory units of memory array 190 are phase change memories (PCM). The phase change memories can change the resistance value of the memory unit through the crystal phase change of the material itself and store the data with the change of the resistance value. The write drivers WR0-WR31 in the write module 160 are configured to provide specific write bit signals to change the crystal phase of the materials of the memory units in the memory array 190. When the write bit signal sets the material in the memory unit to be a crystalline state, the memory unit exhibits a low resistance value. In contrast, when the write bit signal sets the material in the memory unit to be an amorphous state, the memory unit exhibits a high resistance value; thereby logic 1 or logic 0 is stored in the memory unit. For example, a high resistance value can represent logic 1, and a low resistance value can represent logic 0. In contrast, a low resistance value can represent logic 1, and a high resistance value represents logic 0.

Figure 2:
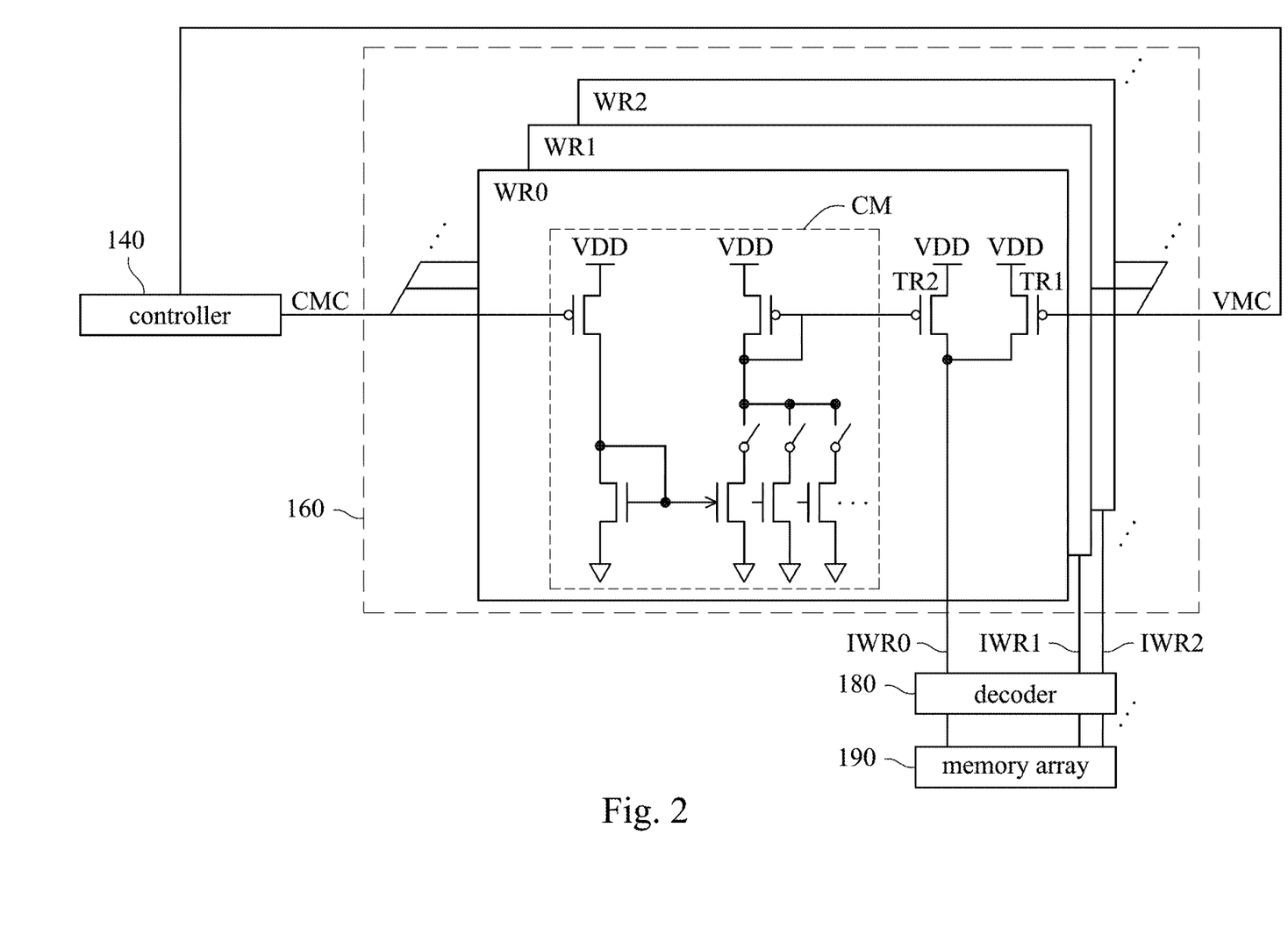
FIG. 2 shows a partial schematic diagram of a memory device in FIG. 1, in accordance with one embodiment of the present disclosure.

Reference is made to FIG. 2. The FIG. 2 shows a partial schematic diagram of a memory device 100 in FIG. 1, in accordance with one embodiment of the present disclosure. The FIG. 2 shows a more detail schematic diagram of the write module 160 of the memory device 100 in FIG. 1, in accordance with one embodiment of the present disclosure. As shown in FIG. 1, the writing module 160 includes write driver WR0, write driver WR1, and write driver WR2 to write driver WR31. For the convenience of description in the embodiment of FIG. 2, only the write driver WR0, the write driver WR1, and the write driver WR2 of the write module 160 are schematically illustrated. The write driver WR0 is configured to output write bit signal IWR0. The write driver WR1 is configured to output write bit signal IWR1. The write driver WR2 is configured to output write bit signal IWR2. The write bit signals IWR0-IWR2 are respectively configured to control the memory units on the three different bit lines in the memory array 190. As shown in FIG. 2, FIG. 2 illustrates the detailed internal architecture of the write driver WR0. The other write drivers WR1-WR31 in FIG. 1 may have a similar structure to WR0 in FIG. 2, and therefore it will not be described repeatedly.

Taking the write driver WR0 as an example, the write driver WR0 includes a current mirror CM, a first transistor TR1, and a second transistor TR2. In the connection relationship, the input terminals of the current mirror CM, the first transistor TR1, and the second transistor TR2 are electrically coupled to the system voltage terminal VDD. The system voltage terminal VDD is electrically coupled to the charge pump 120 of the memory device 100. The control terminal of the current mirror CM is electrically coupled to the controller 140 of the memory device 100. The control terminal of the first transistor TR1 is electrically coupled to the controller 140 of the memory device 100. The current mirror CM outputs a current mirror signal. The output terminal of the current mirror CM is electrically coupled to the control terminal of the second transistor TR2. The output terminals of the first transistor TR1 and the second transistor TR2 are connected to a connection point, and the connection point outputs a write bit signal IWR0. Like the above-mentioned working theory for the write driver WR0, the write driver WR1 outputs the write bit signal IWR1, the write driver WR2 outputs the write bit signal IWR2, and the write driver WR31 outputs the write bit signal IWR31. The output terminals of the write drivers WR0 WR31 are electrically coupled to the decoder 180 of the memory device 100.

Figure 3:
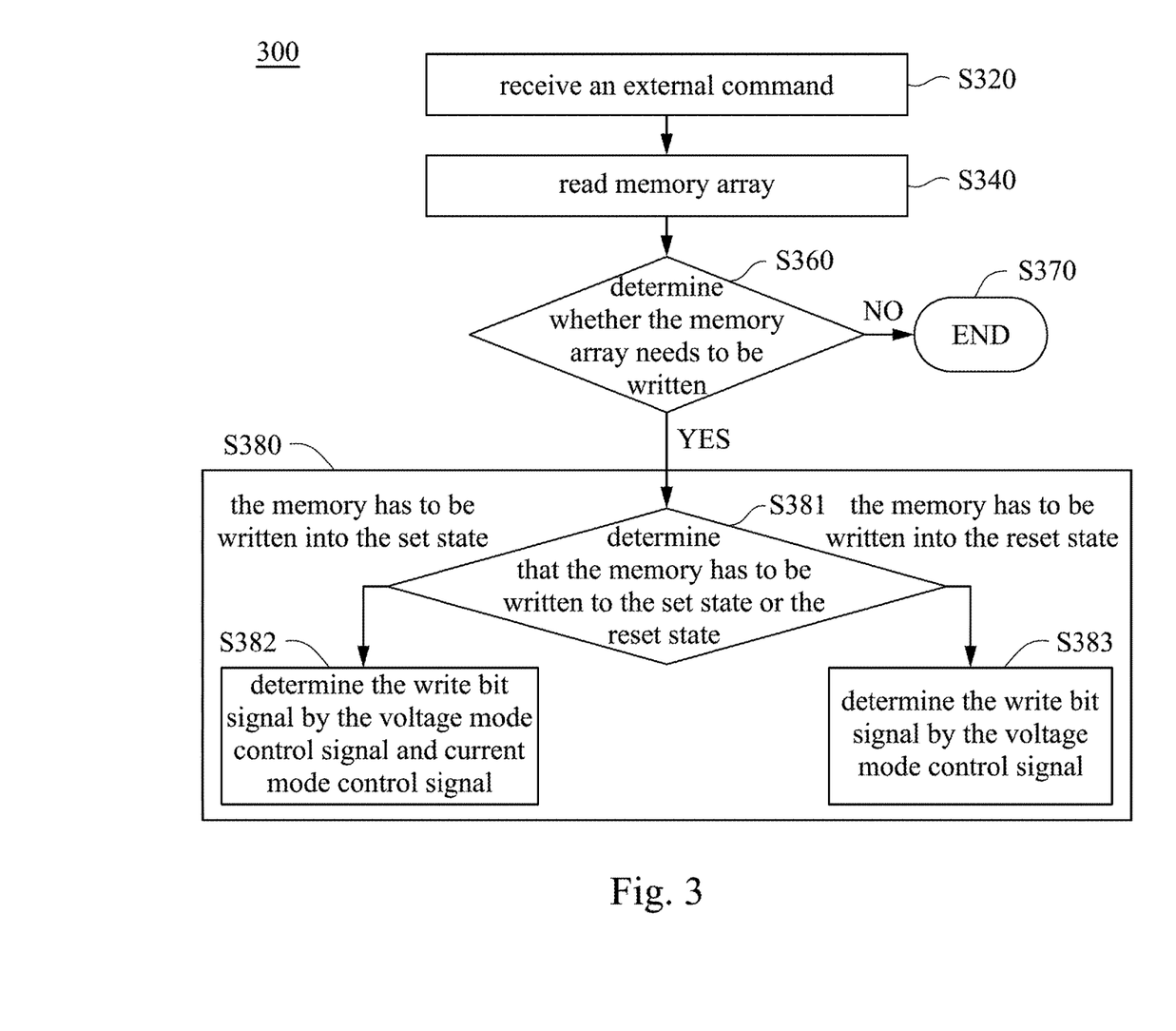
FIG. 3 shows a flowchart of a memory writing method in accordance with one embodiment of the present disclosure.

Reference is made to FIG. 3. The FIG. 3 shows a flowchart of a memory writing method 300 in accordance with one embodiment of the present disclosure. As shown in FIG. 3, the memory writing method 300 includes steps S320 to S383. Please refer to FIG. 1 and FIG. 2 together.

In step S320, the memory device 100 receives an external write bit signal command. In step S340, the controller 140 reads the current storage state of each memory unit in the memory array 190.

In step S360, the controller 140 determines whether the memory array 190 needs to be written or not, according to the external write bit signal command and the current storage state of the memory unit. If the external write bit signal command is same with the state of memory unit currently stored, the memory unit does not need to be written, and the process jumps to step S370 to end the write operation for the memory unit. In an embodiment, the external write bit signal command is currently expected to write "logic 1" to one of the memory units of the memory array 190, and the current storage state of the memory unit read in step S340 is also "logic 1", which is the same as the "logic 1" currently expected to be written. That indicates that the current memory unit has stored the data of "logic 1". Therefore, in this embodiment, the crystal phase state of the memory unit does not need to be changed, so the writing operation is ended. Thereby the number of write operation of the memory unit is reduced and the life time of the memory unit can be extended, but the disclosure of this document is not limited to this.

In another embodiment, If the external write bit signal command is currently expected to write "logic 1" to one of the memory units of the memory array 190, which is the same as the "logic 1" written by the memory unit currently. The write operation of memory unit could still be executed.

If the external write bit signal command and the current write status of the memory unit are different, the memory unit needs to be written. For example, if the external write bit signal command would write "logic 1" to one of the memory units of the memory array 190, but the current data status in the memory is "logic 0", which is different from the external write bit signal command, so that the write operation of memory unit need to be executed.

Then proceeding to execute step S380, step S380 includes step S381 to step S383. In step S380, each of write bit signals generated by the write module 160 is respectively inputted to each of the bit lines. Steps S381 to S383 describe the detailed flow of the write bit signal for one write driver, taking the write driver WR0 as an example. In step S381, the controller 140 determines that the memory must be written to the set state or the reset state according to the external write bit signal command. When the external write bit signal command is the reset state, the phase change memory device is set to a high resistance state. On the contrary, when the external write bit signal command is the set state, the phase change memory device is set to low resistance state.

Figure 4A:
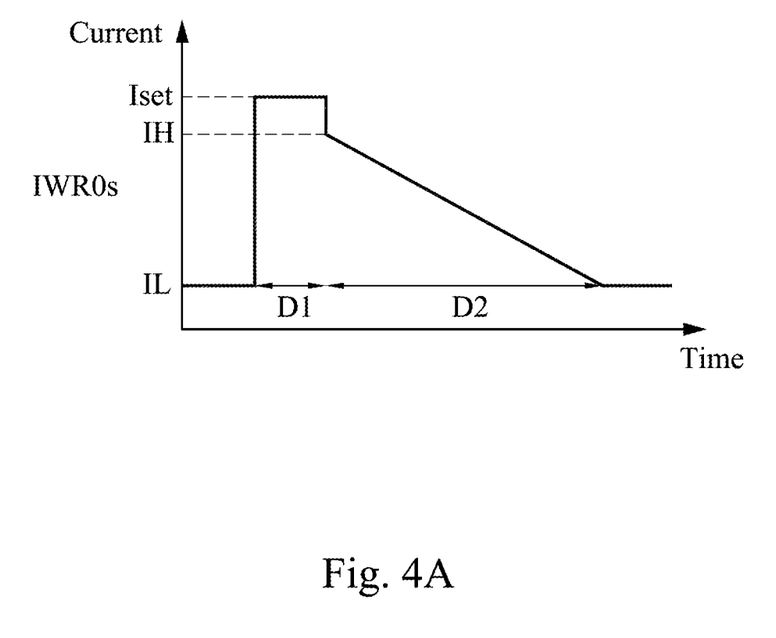
FIG. 4A shows a schematic diagram of the current waveform of set pulse in accordance with one embodiment of the present disclosure.

Please refer to FIG. 4A together. FIG. 4A shows a schematic diagram of the current waveform of the set pulse in accordance with one embodiment of the present disclosure. When the memory has to be written to the set state, the voltage control mode and the current control mode are simultaneously started in step S382. As shown in FIG. 4A and FIG. 2, the controller 140 generates the voltage mode control signal VMC which switching from the low level to the high level, to turn on the first transistor TR1. The controller 140 generates the current mode control signal CMC to indirectly turn on the second transistor TR2. As shown in FIG. 4A, the set state current IWR0$s$ of the write bit signal IWR0 is generated. The set state current IWR0$s$ is switched from the low level IL to the set pulse level Iset. Set pulse level Iset is a current level that is sufficient for the phase change material of the memory being written to reach a melting state. After the pulse level Iset is set to continue for the first time period D1, the controller 140 switches the voltage mode control signal VMC back to the low level to turn off the first transistor TR1. And then, the switches in the current mirror are gradually turned off individually within the second time period D2, so that multiple current branches in the current mirror are gradually turned off individually. The current mirror signal outputted by the current mirror is gradually decreased within the second time period D2: from the high current gradually switches to the low current with the second time period D2, so that the output current of the second transistor TR2 is gradually decreased from the high current state according to the current mirror signal. The set state current IWR0$s$ is gradually decreased from the high level IH to the low level IL within the second time period D2, wherein the high level IH is between the set pulse level Iset and the low level IL.

Figure 4B:
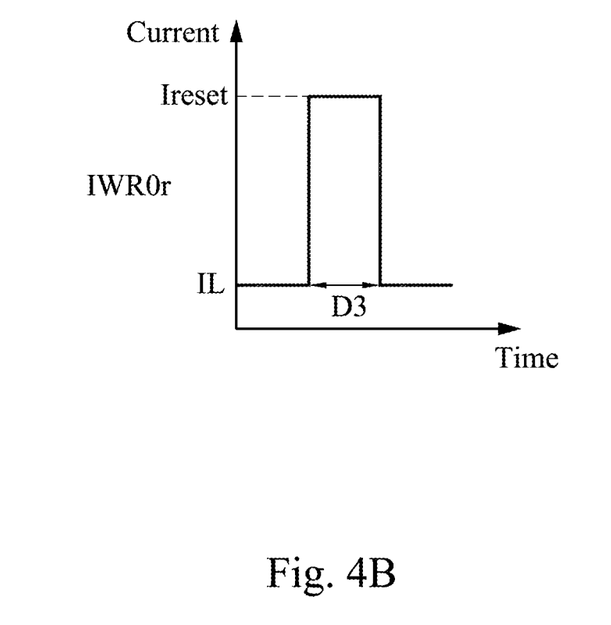
FIG. 4B shows a schematic diagram of the current waveform of reset pulse in accordance with one embodiment of the present disclosure.

Please refer to FIG. 4B together. FIG. 4B shows a schematic diagram of the current waveform of the reset pulse in accordance with one embodiment of the present disclosure. When the memory has to be written to the reset state, proceeding to step S383, the controller 140 generates a voltage mode control signal VMC to turn on the first transistor TR1. The current mode control signal CMC generated by the controller 140 indirectly turns off the second transistor TR2. As shown in FIG. 4B and FIG. 2, the reset state current IWR0$r$ of the write bit signal IWR0 is generated, and the reset state current IWR0$r$ is switched from the low level IL to the reset pulse level Ireset, wherein the reset pulse level Ireset is higher than the set pulse level Iset. After the reset pulse level Ireset is set to continue for the third time period D3, the controller 140 turns off the first transistor TR1 and the second transistor TR2, and the write bit signal IWR0$r$ decreased from the set pulse level Iset to the low level IL. The time period of the third time period D3 is shorter than the first time period D1. The pulse signal of the reset state current IWR0 is outputted via the decoder 180, and the write bit signals IWR0 to WR31 are written to the corresponding bit lines according to the bit address decoded by the decoder 180.

Figure 5A:
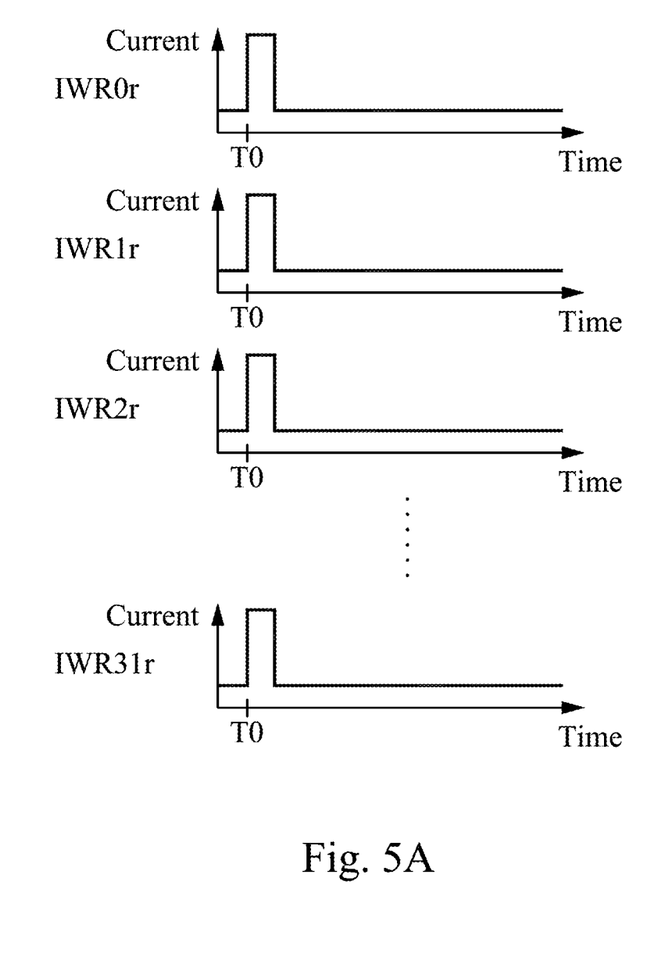
FIG. 5A shows a schematic diagram of the conventional current waveform to reset multiple memory units in accordance with one embodiment of the present disclosure.

In an embodiment, please refer to FIG. 5A. FIG. 5A shows a schematic diagram of the conventional current waveform to reset multiple memory units in accordance with one embodiment of the present disclosure. In this embodiment, there are 32 memory units, but the number is not limited thereto. When the memory unit is written to the reset state, as seen in FIG. 5A, the reset state current IWR0$r$, the reset state current IWR1$r$, and the reset state current IWR2$r$ to the reset state current IWR31$r$ are written by the memory device 100 in a conventional approach. As shown in the current waveform, the reset state current IWR0$r$, the reset state current IWR1$r$, and the reset state current IWR2$r$ to the reset state current IWR31$r$ are all written at the time point T0. The memory device 100 must write 32 memory units simultaneously, and the instantaneous write current is the sum of the reset state current IWR0$r$ to the reset state current IWR31$r$ (IWR0$r$-IWR31$r$).

Figure 5B:
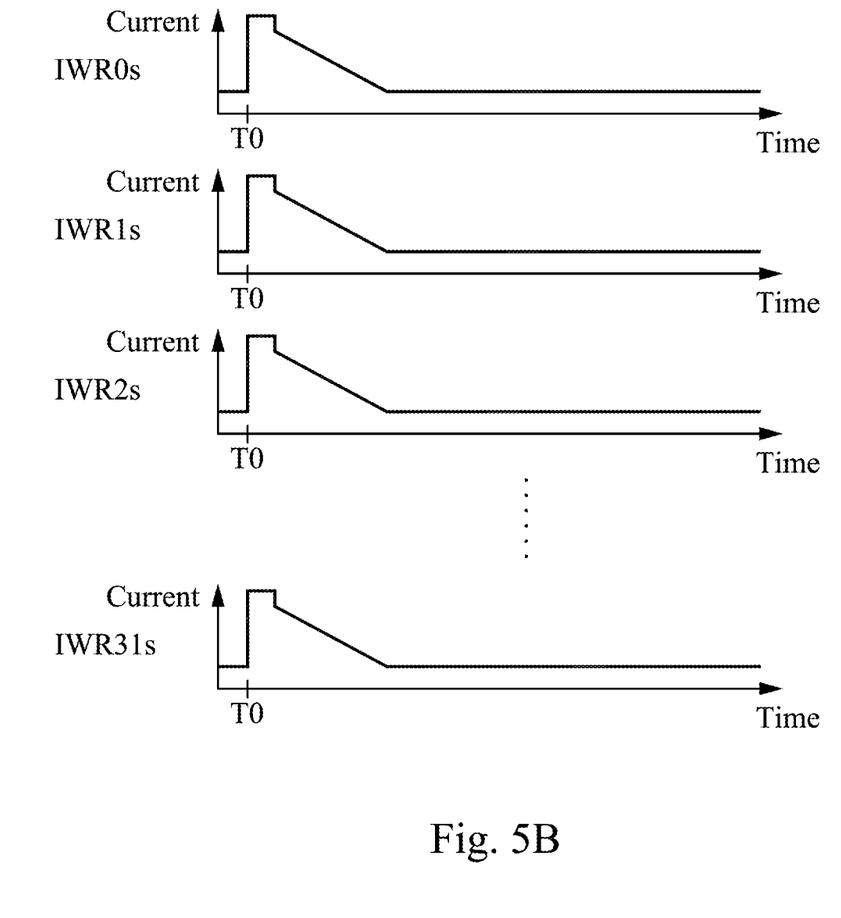
FIG. 5B shows a schematic diagram of the conventional current waveform to set multiple memory units in accordance with one embodiment of the present disclosure.

When the memory unit is written in the set state, please refer to FIG. 5B. FIG. 5B shows a schematic diagram of the conventional current waveform to set multiple memory units in accordance with one embodiment of the present disclosure. As shown in FIG. 5B, the set state current IWR0$s$, the set state current IWR1$s$, and the set state current IWR2$s$ to the set state current IWR31$s$ are written by the memory device 100 in a conventional approach. As shown in the current waveform, the set state current IWR0$s$, the set state current IWR1$s$, and the set state current IWR2$s$ to the set state current IWR31$s$ are all written at the time point T0. The memory device 100 must write 32 memory units simultaneously, and the instantaneous write current is the sum of the set state current IWR0$s$ to the set state current IWR31$s$ (IWR0$s$-IWR31$s$).

In a conventional approach, no matter that the memory device 100 is written to the reset state or the set state will cause a large instantaneous maximum write current. In consequence, a large-area charge pump 120 must be designed in the memory device 100 to provide sufficient instantaneous maximum write current.

Figure 6A:
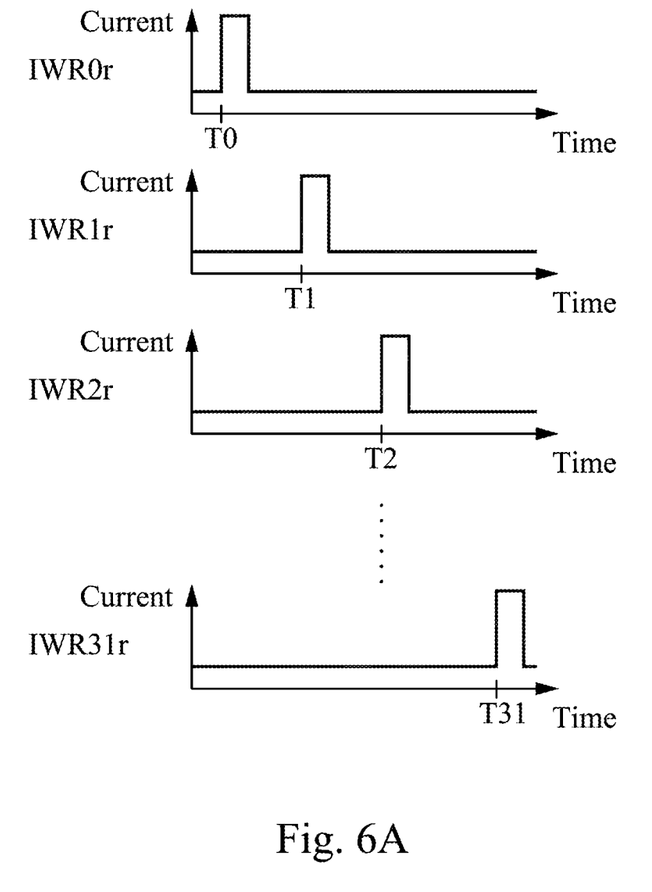
FIG. 6A shows a schematic diagram of the current waveform with sequential time shift to reset multiple memory units in accordance with one embodiment of the present disclosure.

In another embodiment, please refer to FIG. 6A. FIG. 6A shows a schematic diagram of the current waveform with time sequential shift to reset the multiple memory units in accordance with one embodiment of the present disclosure. In this embodiment, there are 32 memory units, but the number is not limited thereto. When the memory unit is written to the reset state, as seen in FIG. 6A, the reset state current IWRo$r$, the reset state current IWRi$r$, and the reset state current IWR2$r$ to the reset state current IWR31$r$ are written by the memory device 100. As shown in the current waveforms, the reset state current IWRo$r$ is written at the time point T0, the reset state current IWRi$r$ is written at the time point T1, the reset state current IWR2$r$ is written at the time point T2, the reset state current IWR31$r$ is written at the time point T31 and the like. It can be seen that the write operation of 32 bit lines is dispersed to 32 different time points (T0~T31). In this embodiment, one write cycle includes 32 different time points. The maximum current required at each time point can be reduced to $\frac{1}{32}$ of the write at the same time, but this disclosure is not limited to this.

In another embodiment, the writing operation of 32 bit lines can also be dispersed to different cycle. For example, the writing operation of 32 bit lines can be dispersed to 4 different time points. At the point T0, the 0th, 4th, 8th, 12th, 16th, 20th, 24th, and 28th bit lines are simultaneously written. At the time point T1, the 1st, 5th, 9th, 13th, 17th, 21st, 25th and 29th bit line are simultaneously written. At the time point T2, the 2nd, 6th, 10th, 14th, 18th, 22nd, 26th, 30th bit lines are simultaneously written. And at the time point T3, the 3rd, 7th, 11th, 15th, 19th, 23th, 27th, 31st bit lines are simultaneously written. In this embodiment, a write cycle contains 4 different time points. In this example, the maximum current required at each time point can be reduced to ¼ of the write at the same time. This disclosure can be configured in various different cycles, and so on, for example, divided into 8 different time points, 16 different time points or other various distributions, wherein the number of time points included in one writing cycle is not limited in the above embodiments.

Figure 6B:
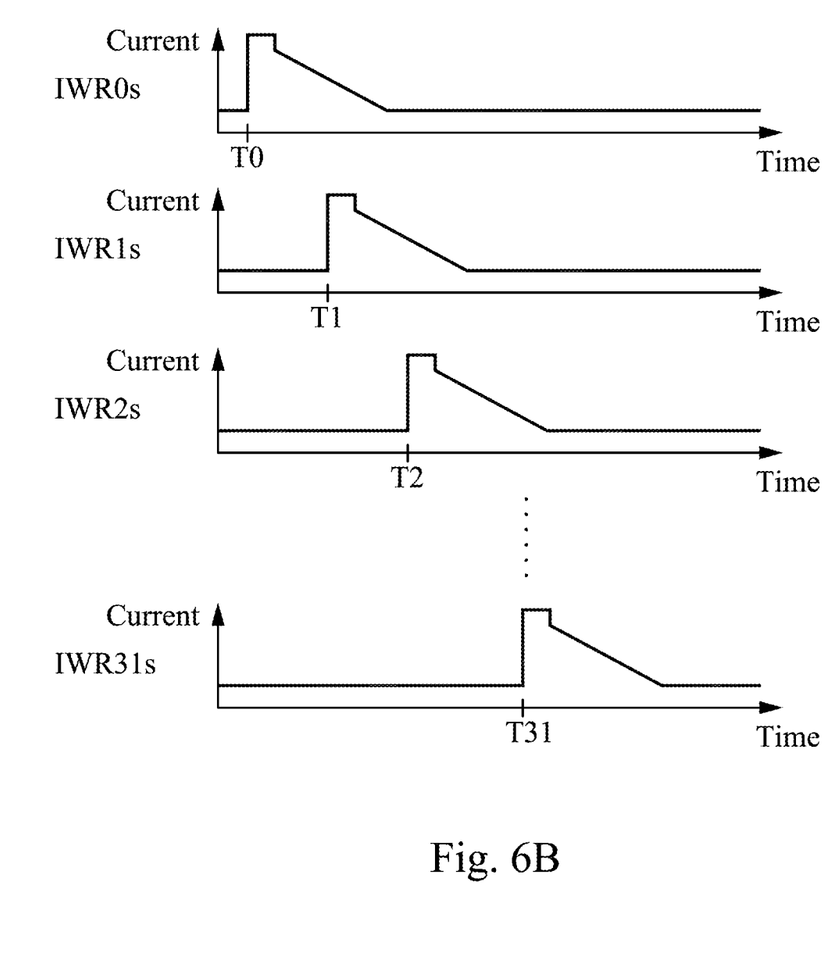
FIG. 6B shows a schematic diagram of the current waveform with sequential time shift to set multiple memory units in accordance with one embodiment of the present disclosure.

When the memory unit is written in the set state, please refer to FIG. 6B. FIG. 6B shows a schematic diagram of the current waveform with sequential time shift to set the multiple memory units in accordance with one embodiment of the present disclosure. As seen in FIG. 6B, the set state current IWR0s, set state current IWR1s, and set state current IWR2s to the set state current IWR31s are written by the memory device 100 in time sequential shift approach. As shown in the current waveforms, the set state current IWR0s is written at the time point T0, the set state current IWR1s is written at the time point T1, the set state current IWR2s is written at the time point T2, the set state current IWR31s is written at the time point T31, and the like. Several time points can be designed within one cycle. The memory device 100 can be programmed to shift the write time of multiple memory units, and the maximum write current is the sum of the write currents of the same cycle.

No matter that the memory device 100 is written to the reset state or the set state by time sequential shift, the instantaneous maximum write current is the sum of the write currents of the same cycle. Since the required instantaneous maximum write current is smaller than the write current of conventional approach, the area of the charge pump 120 designed on the memory device 100 can be effectively reduced.

As a result, as described in the above embodiments, the memory device can control the writing of the reset state and the set state to the memory unit through the voltage mode control signal and the current mode control signal. The memory unit written by a time sequential shift approach could effectively reduce the area of the charge pump 120 in the memory device 100.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device comprising:
   a memory array, comprising a plurality of memory units respectively arranged in a plurality of bit lines;
   a plurality of write drivers configured to generate a plurality of write bit signals respectively input to the bit lines; and
   a controller configured to provide a voltage mode control signal and a current mode control signal, wherein the controller is electrically coupled to the write drivers;
   wherein, each of the write drivers respectively generates, according to the voltage mode control signal and the current mode control signal, one of the write bit signals corresponding to each of the write drivers;
   in response to each of the memory units being in a set state, the controller outputs the voltage mode control signal and the current mode control signal to the write drivers and in response to each of the memory units being in a reset state, the controller outputs the voltage mode control signal to the write drivers.

2. The memory device of claim 1, wherein each of the write drivers comprises:
   a current mirror comprising an input terminal, a plurality of switches, and a plurality of current branches, wherein the current mirror is electrically coupled to the controller, the current mode control signal controls the input terminal of the current mirror and accordingly the current mirror outputs a current mirror signal, and each one of the switches controls a corresponding one of the current branches to be turned on or off, so as to adjust a magnitude of the current mirror signal;
   a first transistor comprising a control terminal, wherein the voltage mode control signal controls the control terminal of the first transistor; and
   a second transistor comprising a control terminal, wherein the current mirror signal controls the control terminal of the second transistor; wherein an output terminal of the first transistor is connected to an output terminal of the second transistor, the first transistor is turned on or off according to the voltage mode control signal, and the second transistor is turned on or off according to the current mirror signal to output the one of the write bit signals.

3. The memory device of claim 2, wherein in response to each of the memory units being in the set state:
   the controller generates the voltage mode control signal and the current mode control signal to simultaneously turns on the first transistor and the second transistor, so that one of the write bit signals is switched from a low level to a set pulse level and sustains at the set pulse level for a first time period; immediately after the first time period, the controller turns off the first transistor and sustains the current mode control signal, so that the second transistor is gradually turned off from the turn-on state according to the magnitude of the current mirror signal in a second time period, and one of the write bit signals is gradually decreased from a high level to the low level in the second time period; and the high level is between the set pulse level and the low level.

4. The memory device of claim 2, wherein in response to each of the memory units being in the reset state:
   the controller generates the voltage mode control signal to turn on the first transistor, and one of the write bit signals is switched from a low level to a reset pulse level and the write bit signal sustains on the reset pulse level for a third time period; and
   the controller turns off the first transistor to decrease one of the write bit signals from the reset pulse level to the low level.

5. The memory device of claim 1, wherein the controller controls the write drivers, so that a plurality of rising edges of the write bit signals are staggered from each other.

6. A memory writing method, configured to generate a plurality of write bit signals, the write bit signals being configured to write a plurality of memory units of plurality of bit lines, the memory writing method comprising:

determining the memory units to be written into a set state or a reset state;

outputting a voltage mode control signal and a current mode control signal to a plurality of write drivers in response to the memory units being required to be written into the set state, so that the write bit signals being generated by the write drivers according to the voltage mode control signal and the current mode control signal; and outputting the voltage mode control signal in response to the memory units being required to be written into the reset state, so that the write bit signals being generated by the write drivers according to the voltage mode control signal.

7. The memory writing method of claim 6, wherein each of the write drivers comprises a first transistor and a second transistor, and an output terminal of the first transistor is connected to an output terminal of the second transistor, the memory writing method comprises:

outputting a current mirror signal according to the current mode control signal and turning on or off the second transistor according to the current mirror signal, so that outputting the one of the write bit signals; and the first transistor is turned on or off according to the voltage mode control signal, so that the one of the write bit signals is outputted.

8. The memory writing method of claim 7, wherein in response to the memory units being required to be written into the set state, the memory writing method comprises:

simultaneously generating the voltage mode control signal and the current mode control signal to turn on the first transistor and the second transistor, switching one of the write bit signals from a low level to a set pulse level, and sustaining the write bit signals at the set pulse level for a first time period;

after the first time period, sustaining the current mode control signal, and gradually turning off the second transistor from the on state according to the current mirror signal, so that one of the write bit signals being gradually decreased from a high level to the low level in a second time period; and the high level is between the set pulse level and the low level.

9. The memory writing method of claim 8, wherein in response to the memory units being required to be written into the reset state, the memory writing method further comprises:

the voltage mode control signal is turned off after the first time period, and the current mode control signal is sustained and inputted to the write drivers.

10. The memory writing method of claim 7, wherein controlling a plurality of write drivers time sequences, so that a plurality of rising edges of the write bit signals being staggered from each other.

11. The memory writing method of claim 7, wherein in response to the memory units being required to be written into the reset state, the memory writing method comprises:

generating the voltage mode control signal to turn on the first transistor, switching one of the write bit signals from a low level to a reset pulse level, and sustaining the write bit signals at the reset pulse level for a third time period; and turning off the first transistor, and one of the write bit signals being decreased from the reset pulse level to the low level.

12. The memory writing method of claim 6, wherein controlling a plurality of write drivers time sequences, so that a plurality of rising edges of the write bit signals being staggered from each other.

* * * * *